United States Patent
Iwasaki et al.

[11] Patent Number: 5,866,950
[45] Date of Patent: Feb. 2, 1999

[54] SEMICONDUCTOR PACKAGE AND FABRICATION METHOD

[75] Inventors: Hiroshi Iwasaki; Hideo Aoki, both of Yokohama, Japan

[73] Assignee: Kabushiki Kaisha Toshiba, Kawasaki, Japan

[21] Appl. No.: 749,028

[22] Filed: Nov. 14, 1996

Related U.S. Application Data

[63] Continuation of Ser. No. 298,273, Aug. 31, 1994, abandoned.

[30] Foreign Application Priority Data

| Sep. 1, 1993 | [JP] | Japan | 5-217503 |
| Dec. 17, 1993 | [JP] | Japan | 5-318633 |
| Mar. 22, 1994 | [JP] | Japan | 6-050757 |

[51] Int. Cl.⁶ .......................... H01L 23/48; H01L 23/52; H01L 29/40
[52] U.S. Cl. .......................... 257/782; 257/783; 257/780
[58] Field of Search .................... 257/629, 737, 257/738, 780, 781, 779, 782, 783

[56] References Cited

U.S. PATENT DOCUMENTS

| 3,495,133 | 2/1970 | Miller | 257/779 |
| 3,887,760 | 6/1975 | Krieger et al. | 257/779 |
| 3,923,231 | 12/1975 | Catalano et al. | 228/194 |
| 4,961,105 | 10/1990 | Yamamoto | 257/679 |
| 4,962,415 | 10/1990 | Yamamoto et al. | 257/679 |
| 5,203,076 | 4/1993 | Banerji et al. | 29/840 |
| 5,350,947 | 9/1994 | Takekawa et al. | 257/737 |
| 5,407,864 | 4/1995 | Kim | 257/783 |

FOREIGN PATENT DOCUMENTS

| 0 231 937 A3 | 8/1987 | European Pat. Off. |
| 0 321 239 A3 | 6/1989 | European Pat. Off. |
| 0321239 | 6/1989 | European Pat. Off. |
| 0 388 011 A3 | 9/1990 | European Pat. Off. |
| 2-7180 | 2/1990 | Japan |
| 3-2099 | 1/1991 | Japan |
| 4051532 | 2/1992 | Japan |
| 4-352439 | 12/1992 | Japan |
| 2 081 974 A | 2/1982 | United Kingdom |
| 2 204 182 A | 11/1988 | United Kingdom |

OTHER PUBLICATIONS

Tasao Soqa et al., "Development of a High–Reliability Flip–Chip Packaging Reinforced by Resin," 433b Electronics and Communications in Japan, Part 2: Electronics, vol. 71, No. 11, pp. 19–27, (Dec. 1988) (New York).

J. Clementi et al., "Flip–Chip Encapsulation on Ceramic Substrates," 43rd Electronic Components & Technology Conference, pp. 175–181, Jun. 1–4, 1993.

"Direct Chip Bonding For Liquid Crystal Display," IBM Technical Disclosure Bulletin, vol. 34, No. 5, pp. 183–184, Oct. 1991.

Primary Examiner—Mahshid D. Saadat
Assistant Examiner—S. V. Clark
Attorney, Agent, or Firm—Finnegan, Henderson, Farabow, Garrett & Dunner, L.L.P.

[57] ABSTRACT

A semiconductor package comprises a circuit board having a wiring circuit including at least a connecting portion, the wiring circuit being formed on a first main surface of the circuit board, a semiconductor chip mounted on the first main surface of the circuit board on face-down basis, an insulation resin layer filled in a space between the semiconductor chip and the circuit board, and a flat-type external connecting terminal electrically connected to the semiconductor chip and formed and exposed to a second main surface of the circuit board.

8 Claims, 6 Drawing Sheets

SEMICONDUCTOR PACKAGE AND FABRICATION METHOD

This application is a continuation of application Ser. No. 08/298,273, filed Aug. 31, 1994, now abandoned.

BACKGROUND OF THE INVENTION

1. Field of the Invention

The present invention relates to a thin-type semiconductor package and fabrication method for use with for example a card-type external storage medium.

2. Description of the Related Art

As storage apparatuses for recording and storing data, for example memory cards are known. These memory cards have restrictions in their size (length, width, and thickness) and the like. Thus, semiconductor chips (IC chips) that are used with the memory cards should be compact. In addition, the memory cards in which the semiconductor chips are mounted should be thin.

To mount semiconductor chips in a limited space with a thickness of 1 mm or less, TAB (Tape Automated Bonding) method and flip chip method, COB (Chip On Board) method are known. As an example of the thin-type packages, a module shown in FIG. 1 is known. The module shown in FIG. 1 comprises a circuit board 2, an external connecting terminal 4, and a mold resin layer 5. A semiconductor chip 1 is mounted on a first main surface of the circuit board 2. The external connecting terminal 4 is connected to a second main surface of the circuit board 2 through a through-hole 3. The mold resin layer 5 seals and coats the mounting region of the semiconductor chip 1. In FIG. 1, reference numeral 6 is a bonding wire.

However, the above-mentioned TAB method is not a practical means from a cost point of view because of: (a) The fabrication cost of a carrier tape is relatively high. (b) Since dedicated metal mold and bonding tool corresponding to the package size are required in the mounting process, the assembling cost is relatively high.

On the other hand, in the above-mentioned flip chip mounting method and COB method, it is difficult to provide KGN (Known Good Die). Normally, the semiconductor chip 1 for use should have been burnt in. However, the burn-in technologies for chips have not been accomplished. Thus, since the semiconductor chip 1 that has not been burnt in should be used, there is a problem on the reliability. In other words, with this semiconductor chip (IC chip) 1, a defect that will take place in the near future cannot be predicted. In other words, the semiconductor chip 1 cannot be burnt in. Thus, in initial practical phases where the semiconductor chip 1 is mounted and thereby a module is formed, a trouble may take place.

Although the problem on the reliability of the semiconductor chip 1 may be solved by repairing or reworking it, the assembling cost will increase and many technical problems will arise. In particular, when a semiconductor chip 1 with many electrode terminals is mounted by the COB method, a long assembling time is required, thereby increasing the cost.

In the TAB method and COB method, a wider mounting area is required than in the flip chip mounting method. Thus, in the TAB method and COB method, the semiconductor package cannot be compactly formed. On the other hand, in the case of a packaged module where one surface is molded, bonding wires 6 often displace in the conventional (ordinary) transfer mold process. In addition, the connecting portions are often disengaged. Thus, there are problems on the reliability and yield. Moreover, since it is difficult to reduce the height of the bonding wires 6 to 0.1 mm or less with the current technologies, this restriction prevents thin-type packages from being accomplished. In addition, since a space for connecting the bonding wires 6 to the external connecting terminals 4 is required along with the mounting region of the semiconductor chip 1, the semiconductor package cannot be compactly formed.

A first object of the present invention is to provide a thin and compact semiconductor package.

A second object of the present invention is to provide a semiconductor package that is fabricated with relatively low cost and has high reliability.

A third object of the present invention is to provide a thin-type high-reliability semiconductor package suitable for a detachable memory portion for use with a memory card or the like.

A fourth object of the present invention is to provide a fabrication method for fabricating a compact semiconductor package with high yield.

A fifth object of the present invention is to provide a fabrication method for easily fabricating a semiconductor package with high reliability at a relatively low cost.

A sixth object of the present invention is to provide a fabrication method for easily fabricating a thin-type high-reliability semiconductor package suitable for a detachable memory portion for use with a memory card or the like.

SUMMARY OF THE INVENTION

A first aspect of the present invention is a semiconductor package comprising a circuit board having a wiring circuit including at least a connecting portion, the wiring circuit being formed on a first main surface of the circuit board, a semiconductor chip mounted on the first main surface of the circuit board on face-down basis, an insulation resin layer filled in a space between the semiconductor chip and the circuit board, and a flat-type external connecting terminal electrically connected to the semiconductor chip and formed and exposed to a second main surface of the circuit board.

A second aspect of the present invention is a semiconductor package, comprising a circuit board having a wiring circuit including at least a connecting portion, the wiring circuit being formed on a first main surface of the circuit board, a semiconductor chip mounted on the first main surface of the circuit board on face-down basis, an insulation resin layer filled in a space between the semiconductor chip and the circuit board, and a flat-type external connecting terminal electrically connected to the semiconductor chip and formed and exposed to a second main surface of the circuit board, wherein the connecting portion of the circuit board and an electrode terminal portion of the semiconductor chip are bonded by solid-phase diffusion interconnection.

A third aspect of the present invention is a method for fabricating a semiconductor package according to the present invention, comprising the steps of (a) aligning and disposing a semiconductor chip on a first main surface of a circuit board so that an electrode terminal portion of the semiconductor chip accords with a connecting portion of a wiring circuit of the circuit board, the wiring circuit including at least the connecting portion and being formed on the first main surface of the circuit board, the circuit board having a flat-type external connecting terminal, the flat-type external connecting terminal being formed on a second main surface of the circuit board, (b) securing and connecting the electrode terminal portion of the semiconductor chip and the bonding portion of the wiring circuit so as to assemble the electrode terminal portion of the semiconductor chip and the connecting portion of the wiring circuit, (c) filling an insulation resin in a space between the upper surface of the circuit board and the lower surface of the semiconductor chip, which are assembled, and (d) hardening the filled insulation resin.

A fourth aspect of the present invention is a method for fabricating a semiconductor package, comprising the steps of (a) aligning and disposing a semiconductor chip on a first main surface of a circuit board so that an electrode terminal portion of the semiconductor chip accords with a connecting portion of a wiring circuit of the circuit board, the wiring circuit including at least the connecting portion and being formed on the first main surface of the circuit board, the circuit board having a flat-type external connecting terminal, the flat-type external connecting terminal being formed on a second main surface of the circuit board, (b) bonding the electrode terminal portion of the semiconductor chip and the connecting portion of the wiring circuit by solid-phase diffusion interconnection so as to assemble the electrode terminal portion of the semiconductor chip and the connecting portion of the wiring circuit, (c) filling an insulation resin in a space between the upper surface of the circuit board and the lower surface of the semiconductor chip, which are assembled, and (d) hardening the filled insulation resin.

A fifth aspect of the present invention is a method for fabricating a semiconductor package, comprising the steps of (a) heating at least one of a connecting portion of a circuit board and an electrode terminal portion of a semiconductor chip at a predetermined temperature, the circuit board having a wiring circuit containing at least a connecting portion, the connecting portion being disposed on a first main surface of the circuit board, a flat-type external connecting terminal being disposed on a second main surface of the circuit board, (b) aligning and disposing the electrode terminal portion of the semiconductor chip to the connecting portion of the first main surface of the circuit board, (c) applying a load to the circuit board and the semiconductor chip, which are aligned and disposed, so as to bond the circuit board and the semiconductor chip by solid-phase diffusion interconnection, (d) filling an insulation resin in a space between the upper surface of the circuit board and the lower surface of the semiconductor chip, which are bonded by the solid-phase diffusion interconnection, and (e) hardening the filled insulation resin.

A sixth aspect of the present invention is a method for fabricating a semiconductor package, comprising the steps of (a) aligning and disposing an electrode terminal portion of a semiconductor chip to a connecting portion of a circuit board, the circuit board having a wiring circuit and a flat-type external connecting terminal, the wiring circuit including at least a connecting portion made of gold, the wiring circuit being disposed on a first main surface of the circuit board, the external connecting terminal being disposed on a second main surface of the circuit board, (b) applying a load to the circuit board and the semiconductor chip, which are aligned and disposed, so as to contact the connecting portion and the electrode terminal portion, (c) filling an insulation resin in a space between the upper surface of the circuit board and the lower surface of the semiconductor chip while applying the load to the circuit board and the semiconductor chip so as to prevent the circuit board and the semiconductor chip from dislocating, and (d) hardening the filled insulation resin.

In the present invention, both a connecting portion on a surface of a circuit board and an electrode terminal portion of a semiconductor chip or an electronic device including a semiconductor chip mean a part of wiring, a conventional electrode, or a metal bump that can be connected to a part of wiring or an electrode.

According to a first aspect of the present invention, (A) a semiconductor chip (IC chip or the like) is mounted on a first main surface of a resin circuit board or a ceramic circuit board, (B) a mold sealing resin layer is omitted from the device mounting surface, thereby reducing the thickness, volume, and cost, (C) an external connecting terminal is disposed on a second main surface (non-device mounting surface) of the circuit board. In such a simple construction, a thin-type semiconductor package is provided. In other words, since the mold sealing resin layer is omitted from the upper surface (first main surface) of the circuit board, the thickness of the semiconductor package is reduced. Namely, since the surface of the silicon (Si) semiconductor chip is dense and rigid, the mold sealing resin layer can be omitted.

According to a second aspect of the present invention, predetermined electronic devices including a semiconductor chip (IC chip) are mounted on a first main surface of a circuit board on face-down basis. The electronic devices mounted on the circuit board are sealed with a resin being molded so as to reduce the thickness, volume, and cost. In addition, an external connecting terminal is disposed on a second main surface (non-mold surface) of the circuit board so that the semiconductor package can be formed in a card shape. Thus, the semiconductor package can be securely and stably protected. In addition, a thin and compact semiconductor package can be easily formed. In other words, since the characteristics of the semiconductor package are stable and the reliability thereof is high, it is suitable for a card memory or the like.

In a fabrication method for fabricating a semiconductor package according to the present invention, when the circuit board and the semiconductor chip are aligned, connected, and assembled, a relatively simple means that follows may be employed. For example, a conductive paste layer is formed on a connecting portion of the circuit board. The electrode terminal portion of the semiconductor chip may be press-fitted and connected to the conductive paste layer. Alternatively, the connecting portion of the circuit board surface and the electrode terminal portion of the semiconductor chip may be bonded by solid-phase diffusion interconnection. In other words, the connecting portion of the circuit board and the electrode terminal portion of the semiconductor chip are heated so that solid-phase diffusion interconnection takes place. Thus, since the solid-phase diffusion interconnection takes place in the connecting portion and electrode terminal portion that are made of for example gold, they are electrically and mechanically connected. In this solid-phase diffusion interconnection and connection method, before the circuit board and semiconductor chip are aligned and mounted, either the connecting portion of the circuit board or the electrode terminal portion of the semiconductor chip, or both of them are heated so that required solid-phase diffusion interconnection takes place.

In another method for fabricating a semiconductor package, when a circuit board and a connecting terminal of an electronic device are secured, connected, and assembled, a relatively simple means that follows may be employed. The connecting terminal on the circuit board is formed of for example conductive paste. The electrode terminal portion of the electronic device is press-fitted and connected to the circuit board. In this fabrication method, the assembled module is aligned and mounted in a metal mold deaerated or decompressed. A mold resin is liquified so that it has proper fluidity. Alternatively, a liquid resin (for example, epoxy resin) is used. The mold resin liquified or the liquid resin is filled in the metal mold with a predetermined pressure so as to mold one surface of the circuit board. Thus, since the assembled module is prevented from being damaged and the terminal connecting portion from peeling off, the semiconductor package with high yield and reliability can be provided.

According to the first aspect of the present invention, the semiconductor package is densely packaged with the semiconductor chip being mounted. Thus, the semiconductor package is securely and stably protected. In addition, the semiconductor package is easily formed in thin and compact shape. In other words, since the semiconductor package has stable characteristics and high reliability, it is suitable for a card memory or the like.

According to the fabrication method of the third aspect of the present invention, an insulation resin is filled in the space between the upper surface of the assembled circuit board and the lower surface of the semiconductor chip preferably by the following means. A condition that the filling (sealing) resin has proper fluidity is set (for example, by heating means). Alternatively, a liquid resin (for example, liquid epoxy resin) is used. The resin is filled in the space by capillary phenomenon and then hardened. In this method, the assembled semiconductor chip can be prevented from being damaged and the terminal connecting portion from peeling off. Thus, the semiconductor package with high yield and reliability can be provided. When the semiconductor chip is mounted on the circuit board by solid-phase diffusion interconnection, the reliability of electric connections can be much improved.

These and other objects, features and advantages of the present invention will become more apparent in light of the following detailed description of a best mode embodiment thereof, as illustrated in the accompanying drawings.

DESCRIPTION OF THE PREFERRED EMBODIMENTS

Next, with reference to FIGS. 2 to 15, embodiments of the present invention will be described.

First Embodiment

Figure 2:
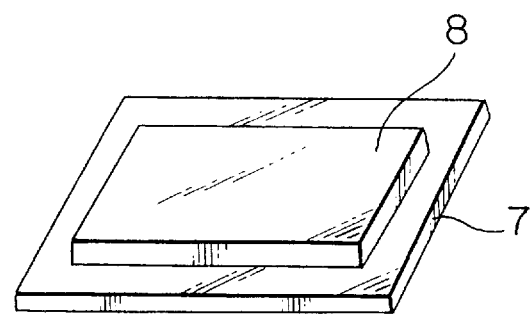
FIG. 2 is a perspective top view showing a construction of principal portions of a semiconductor package according to a first embodiment of the present invention.
Figure 3:
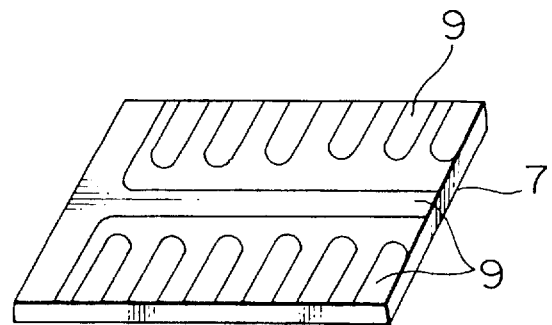
FIG. 3 is a perspective bottom view showing the construction of the semiconductor package according to the first embodiment of the present invention.

FIG. 2 is a perspective upper view showing a construction of principal portions of a semiconductor package according to a first embodiment of the present invention. FIG. 3 is a perspective lower view of the semiconductor package of FIG. 2. In FIGS. 2 and 3, reference numeral 7 is a circuit board having a mounting region (such as a wiring circuit including a connecting portion) of a semiconductor chip. The mounting region is formed on a first main surface of the circuit board 7. Reference numeral 8 is a semiconductor chip (such as an IC chip) mounted on the first main surface of the circuit board 7. Reference numeral 9 is a flat-type external connecting terminal formed on a second main surface of the circuit board 7 through a through-hole (not shown). An insulation resin layer (not shown) is filled in the space between the upper surface of the circuit board 7 and the lower surface of the semiconductor chip 8, thereby incorporating the circuit board 7 with the semiconductor chip 7. Thus, the resultant semiconductor package is reinforced.

Next, a fabrication method for fabricating the above-described semiconductor package will be described.

Figure 4:
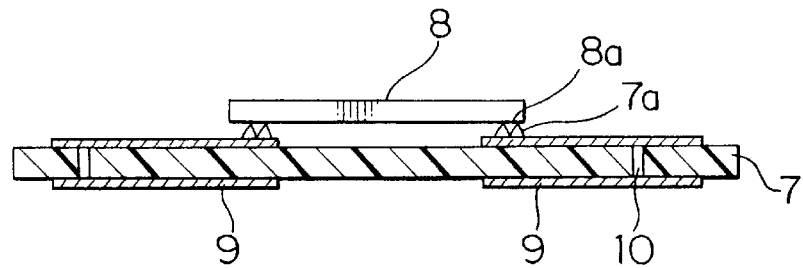
FIG. 4 is a sectional view showing a construction of principal portions of a fabrication step of the semiconductor module according to the first embodiment of the present invention.
Figure 5:
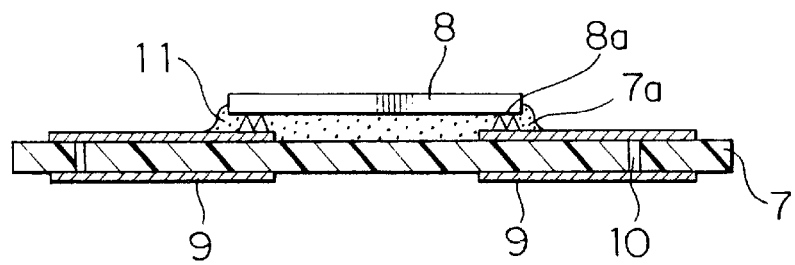
FIG. 5 is a sectional view showing the construction of the principal portions of the semiconductor package according to the first embodiment of the present invention.

FIG. 4 is a sectional view schematically showing a fabrication method for fabricating a module. First, a resin circuit board 7 is prepared. The circuit board 7 has a wiring circuit and a flat-type external connecting terminal 9. The wiring circuit including a connecting portion for mounting a flip chip is formed on the first main surface of the circuit board. The flat-type external connecting terminal 9 is formed on the rear surface (a second main surface) of the circuit board 7. The external connecting terminal 9 is connected to the wiring circuit through a through-hole 10. For example, the length, width, and thickness of the resin circuit board 7 are 17 mm, 7 mm, and 0.2 mm, respectively. The length, width, and thickness of the semiconductor chip (IC chip) 8 are 15 mm, 5 mm, and 0.2 to 0.5 mm, respectively. The semiconductor chip 8 is mounted on the resin circuit board 7.

The circuit board 7 is secured to a stage of a screen printer with a vacuum sucking mechanism. A conductive paste is deposited on the circuit board 7 corresponding to the electrode connecting portion of the semiconductor chip 8 by screen printing method so as to form a connecting pad. The connecting pad is a connecting portion 7a. With a metal mask having an opening (for example, with a width of 150 μm and a length of 150 μm) corresponding to the electrode terminal portion (for example, with a width of 100 μm and a length of 100 μm), a silver paste (for example, with a grain diameter of 1 μm and a viscosity of 1000 ps) is printed on the first main surface of the circuit board 7 by screen printing method so as to form a connecting pad (for example, with a diameter of 150 μm and a height of 80 μm) on the connecting surface. The connecting pad is a connecting portion 7a.

A gold bump is formed on the connecting electrode surface of the semiconductor chip 8 by electroplating method. Alternatively, a gold ball bump (for example, with a height of 30 μm, a width of 100 μm, and a length of 100 μm) is formed by ball bonding method. Thus, the semiconductor chip 8 is provided with an electrode terminal portion 8a.

Thereafter, the semiconductor chip 8 is aligned and disposed on the first main surface of the circuit board 7 so that the electrode terminal portion 8a accords with the connecting portion 7a. The connecting portions 7a and 8a of the circuit board 7 and the semiconductor chip 8 are pressured. Thus, the electrode terminal portion 8a is press-fitted to the connecting portion 7a so that at least the forward edge portion of the electrode terminal portion 8a is buried into the connecting portion 7a. Consequently, the module is assembled. The silver paste, which forms the connecting portion 7a, is heat-hardened. Thus, the flip chip bonding process is completed. In other words, the semiconductor chip 8 is secured to the circuit board 7 and electrical connections are made therebetween. In this process, if there is a chance where the circuit board 7 may be warped, a proper amount (for example, 0.1 mm³ or less) of a heat hardening resin (heat hardening adhesive agent) is preferably applied to a region other than the connecting portion 7a of the circuit board 7. In this case, when pressure is applied in the flip chip bonding process, the heat hardening resin should be heated and hardened.

After the module was assembled, a resin filling process is performed. In other words, the space between the lower surface of the semiconductor chip 8 and the upper surface of the circuit board 7 is filled with an insulation resin (for example, liquid epoxy resin) by capillary phenomenon. In the selective resin filling process, a proper amount of resin is filled in the space. In addition, part of resin is preferably present on a side edge portion of the semiconductor chip 8. Thus, after the resin process was performed, the resin is hardened (solidified) by heat. Consequently, the semiconductor package shown in FIG. 5 can be provided. The semiconductor chip 8 of the semiconductor package is secured to the circuit board 7 by the insulation resin layer 11. In addition, the insulation of the semiconductor chip 8 against the circuit board 7 can be kept. In this condition, although the upper surface of the semiconductor chip 8 is exposed, since silicon, which composes the semiconductor chip 8, is dense and rigid, the surface of the circuit board 7 is protected. Thus, it was found that no problem takes place on the reliability of the semiconductor package.

Second Embodiment

In the construction of the first embodiment, a semiconductor chip 8 has an electrode terminal porion 8a. The electrode terminal portion 8a is formed of a connecting bump made of solder (for example, 63Sn-37Pb) with a height of 100 μm deposited on an electrode terminal surface (with a width of 100 μm and a length of 100 μm) by selective plating method or evaporating method (with a solder mask). A circuit board 7 has a connecting portion 7a. The connecting portion 7a is made of a solder paste and formed on the circuit board 7 by screen printing method. The semiconductor chip 8 is aligned and temporarily secured on a first main surface of the circuit board 7 by a flip chip bonder. Thus, a module is formed. Thereafter, the module is loaded into a solder reflow furnace. In the solder reflow furnace, the module is heated at a temperature exceeding the solder melting point (183° C.) and then cooled.

Thereafter, in the same condition as the first embodiment, an insulation resin is selectively filled in the space between the lower surface of the semiconductor chip 8 and the upper surface of the circuit board 7. Thus, a semiconductor package is provided. As with the first embodiment, this semiconductor package is thin and compact. In addition, the semiconductor package has high characteristic reliability and high yield.

Third Embodiment

Figure 6:
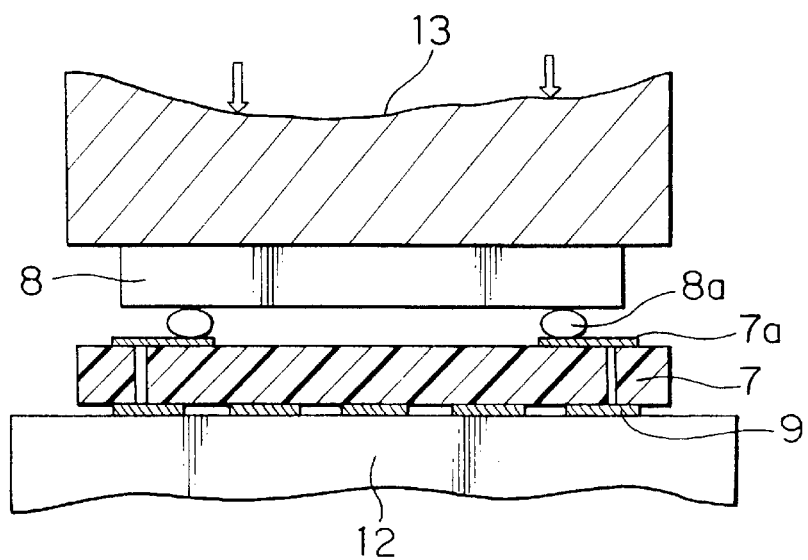
FIG. 6 is a sectional view showing a semiconductor chip aligned, disposed, and pressured on a first main surface of a circuit board in a fabrication step of a semiconductor package according to a third embodiment of the present invention.
Figure 7:
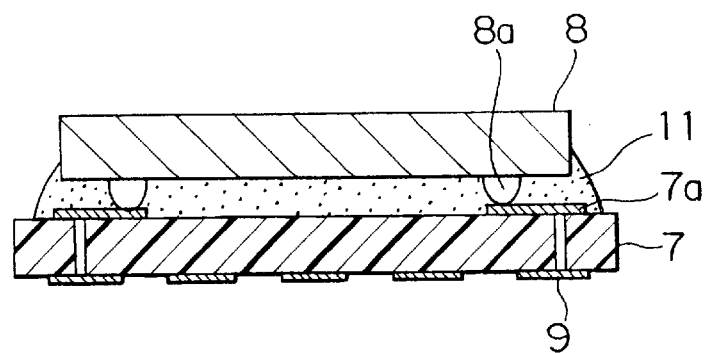
FIG. 7 is a sectional view showing a semiconductor package where a semiconductor chip is aligned, disposed, and pressured on the first main surface of the circuit board and a resin is filled in the space therebetween and hardened in another fabrication step of the semiconductor package according to the third embodiment of the present invention.

FIGS. 6 and 7 schematically show a third embodiment of the present invention. An alumina circuit board (or aluminum nitride circuit board or resin circuit board) 7 is provided. The circuit board 7 has a wiring circuit for mounting a flip chip. The wiring circuit includes a connecting portion 7a made of gold. The wiring circuit is formed on a first main surface of the circuit board 7. In addition, a semiconductor chip 8 is prepared. The semiconductor chip 8 has an electrode terminal portion 8b that is formed of a gold bump with a height of 30 μm, a width of 100 μm, and a length of 100 μm by electroplating method (or ball bonding method).

Thereafter, as shown in FIG. 6, the circuit board 7 and the semiconductor chip 8 are aligned, disposed, and secured on a stage 12 of a flip chip bonder. To prevent the circuit board 7 from being warped and level it, the circuit board 7 is kept on the stage 12 by vacuum deaeration. The circuit board 7 is heated so that the temperature of at least the gold connecting portion 7a thereof is for example in the range from 350° C. to 450° C. Thereafter, the semiconductor chip 8 which is fixed on the pick-up head 13 of the flip tip bonder by vacuum deaeration is heated so that the temperature of at least the gold bump forming the electrode terminal portion 8a is for example in the range from 350° C. to 450° C. In this condition, the gold bump is aligned with the metal connecting portion 7a of the circuit board 7. Thereafter, a predetermined load that is for example in the range from 10 g to 100 g is applied to each electrode terminal portion 8a (with a height of 30 μm, a width of 100 μm, and a length of 100 μm) so that the connecting portion 7a and the electrode terminal portion 8a are bonded by solid-phase diffusion interconnection.

The solid-phase diffusion interconnection bonding is performed by plastic- deforming the interface of same type metals or different type metals. Thus, oxide films at the interface are destroyed and the surfaces thereof are activated. Since new surfaces contact each other, both the metals diffuse and thereby they are bonded.

Thus, in this embodiment, the metal connecting portion 7a and the metal electrode terminal portion 8a are bonded by the solid-phase diffusion interconnection. However, it should be noted that the materials of the metal connecting portion 7a and the metal electrode terminal portion 8a are not limited to gold. In other words, as long as metals are bonded by the solid-phase diffusion interconnection, without departing from the spirit and scope of the present invention, various materials may be used. For example, a combination of a tin connecting portion and a gold electrode connecting portion (gold bump) may be used. In addition, a combination of a aluminum connecting portion and a gold electrode terminal portion (gold bump) may be used.

In this embodiment, although the metal connecting portion 7a of the circuit board 7 on the stage 12 of the flip chip bonder and the gold electrode terminal portion 8a of the semiconductor chip 8 on the pickup head 13 are heated at the predetermined temperatures. However, as long as they are bonded by the solid-phase diffusion interconnection, one of them may be heated at the predetermined temperature. For example, when the metal connecting portion 7a of the circuit board 7 on the stage 12 of the flip chip bonder and the gold electrode terminal portion 8a of the semiconductor chip 8 on the pickup head 13 can be bonded by the solid-phase diffusion interconnection with ultrasonic vibrations, it is not necessary to heat them.

Thereafter, the module of the circuit board 7 and the semiconductor chip 8 are removed from the stage 12. In the same condition as the first embodiment, an insulation resin is filled in the space between the circuit board 7 and the semiconductor chip 8. In the resin filling process, when the temperature is properly raised, the resin is easily filled in the space by the capillary phenomenon. Thus, after the resin filling process was performed, when the filled resin 21 is hardened, as shown in FIG. 7, a semiconductor package where the connecting portion 7a and the electrode terminal portion 8a are bonded by the solid-phase diffusion interconnection is provided.

Fourth Embodiment

Figure 8:
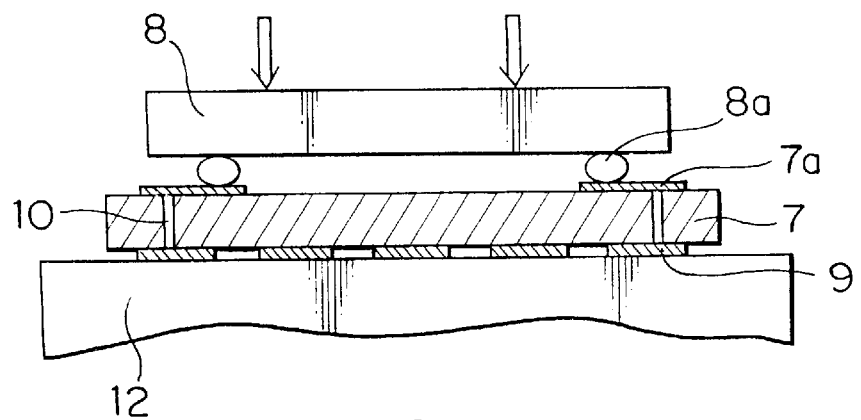
FIG. 8 is a sectional view showing a semiconductor chip aligned, disposed, and pressured on a first main surface of a circuit board in a fabrication step of a semiconductor package according to a fourth embodiment of the present invention.
Figure 9:
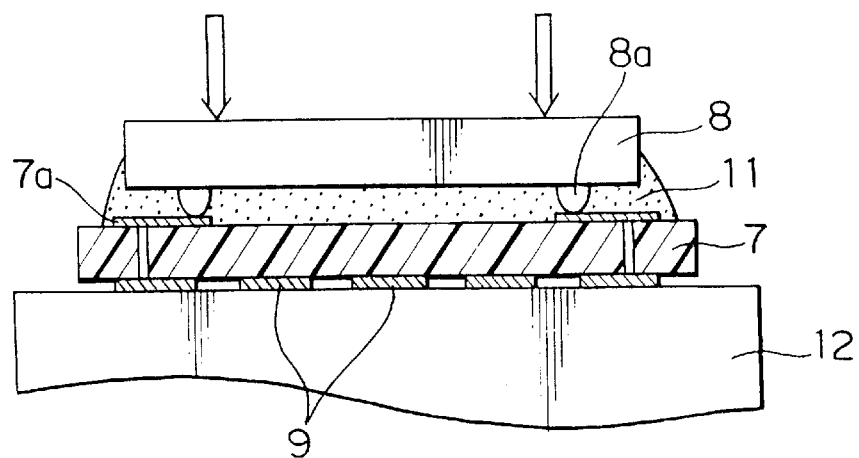
FIG. 9 is a sectional view showing a semiconductor package where a semiconductor chip is aligned, disposed, and pressured on the first main surface of the circuit board and a resin is filled in the space therebetween and hardened in another fabrication step of the semiconductor package according to the fourth embodiment of the present invention.
Figure 10:
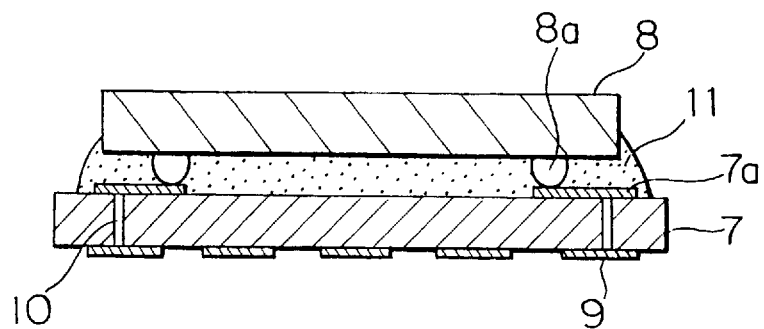
FIG. 10 is a sectional view showing the semiconductor package in another fabrication process according to the fourth embodiment of the present invention.

FIGS. 8, 9, and 10 schematically show a fabrication method for fabricating a semiconductor package according to a fourth embodiment of the present invention. A resin circuit board (or alumina circuit board or aluminum nitride circuit board) 7 is prepared. The circuit board 7 has a wiring circuit and a thin-type external connecting terminal. The circuit board 7 mounts a flip chip and includes a connecting portion 7a made of gold. The wiring circuit is formed on a first main surface of the circuit board 7. The external connecting terminal is formed on a second main surface of the circuit board 7. In addition, a semiconductor chip 8 with an electrode terminal portion 8a is prepared. The electrode terminal portion 8a has a gold bump with a height of 30 $\mu$m, a width of 100 $\mu$m, and a length of 100 $\mu$m. As shown in FIG. 8, the resin circuit board 7 and the semiconductor chip 8 are aligned and disposed on a stage 12 of a flip chip bonder. The resin circuit board 7 is kept by vacuum deaeration so as to prevent the resin circuit board 7 from being warped and level it. The gold bump is aligned and disposed on the gold connecting portion 7a. A load (pressure) is applied to the semiconductor chip 8 so that the connecting portion 7a and the electrode terminal portion 8a are brought into contact with each other.

While such a pressure is being applied, in the same condition as the first embodiment, an insulation resin is filled in the space between the resin circuit board 7 and the semiconductor chip 8. In the resin filling process, when the temperature is properly raised, the effect of capillary phenomenon is improved. Thus, the resin filling process can be more easily performed. Thereafter, as shown in FIG. 9, while a predetermined load is being applied to the semiconductor chip 8, a heating process is performed for the module of the resin circuit board 7 and the semiconductor chip 8. Thus, the filled resin 11 is hardened so as to prevent the connected portion (of the connecting portion 7a and the electrode terminal portion 8a having the gold bump) from dislocating. Consequently, a semiconductor package where the semiconductor chip 8 is secured and held on the resin circuit board 7 is provided. FIG. 10 is a sectional view showing the construction of the semiconductor package fabricated by the fabrication method according to the fourth embodiment of the present invention.

According to the fourth embodiment, a heating process at a high temperature for solid phase diffusion bonding is not necessary. Thus, when the circuit board 7 and the semiconductor chip 8 are connected, the connected portion is free of stress distortion caused by heat expansion. In other words, in a reliability test such as high and low temperature cycle test, the semiconductor package provides high reliability.

Figure 11:
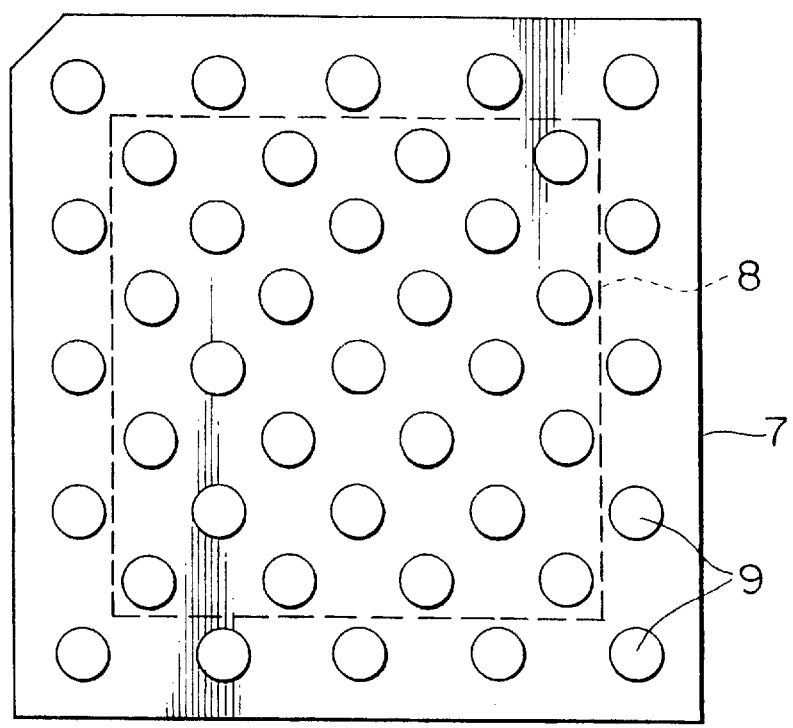
FIG. 11 is a perspective plan view showing the construction of the semiconductor package according to the fourth embodiment of the present invention.

FIG. 11 is a perspective plan view showing a construction of the semiconductor package fabricated by the fabrication method according to the fourth embodiment of the present invention from the flat-type external connecting terminal 9 side. In this construction, the semiconductor chip 8 (with a width of 5 mm and a length of 5 mm) is mounted on the circuit board 7 (with a width of 7 mm and a length of 7 mm). Each side of the circuit board 7 has an allowance of 1 mm in consideration of swell-out of the filled resin 11. The flat-type external connecting terminal 9 formed on the second main surface of the circuit board 7 is for example LGA (Land Grid Array) or BGA (Ball Grid Array). In reality, the external connecting terminal 9 is formed of pins disposed in a zigzag pattern with a pin pitch of 1 mm and a grid diameter of 0.5 mm. To identify the location of the external connecting terminal 9, one of four corners is slightly cut. In this construction, since no solder is used for the connected portion, the semiconductor package can be mounted on a base substrate or the like by reflowing solder without difficulties.

In this embodiment, the construction for the resin circuit board was described. However, it should be noted that the present invention is not limited to such a construction. Without departing from the spirit and scope of the present invention, the circuit board may be modified in various manners. For example, instead of the resin circuit board, an alumina circuit board or an aluminum nitride circuit board may be used. The size of the circuit board depends on the size of a semiconductor chip mounted thereon. In addition, the identification mark of the semiconductor package may be printed on an exposed surface of the semiconductor chip.

In this construction, when the thickness of the circuit board 7 is in the range from 0.2 to 0.5 mm, the thickness of the semiconductor chip is in the range from 0.2 to 0.5 mm, and the distance between the circuit board 7 and the semiconductor chip 8 is 0.03 mm, a semiconductor package with a thickness of 1 mm or less can be provided.

According to the semiconductor package of the fourth embodiment of the present invention, since it is thin and compact and has high reliability in characteristics and functions, it is suitable for use with a functional device of a card memory. In particular, since the semiconductor package is thin, the selection range of the thickness of the resin board and IC chip mounted thereon can be widened. Thus, the characteristics and functions corresponding to the applications for use with the semiconductor package can be adjusted. In addition, the scope of the applications of the semiconductor package is widened.

Fifth Embodiment

Figure 12:
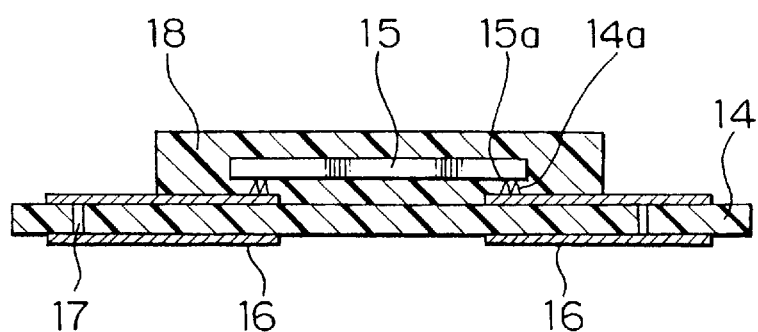
FIG. 12 is a sectional view showing a construction of principal portions of a semiconductor package according to a fifth embodiment of the present invention.

FIG. 12 is a sectional view showing a construction of principal portions of a semiconductor package according to a fifth embodiment of the present invention. In FIG. 12, reference numeral 14 is a resin circuit board having a region for mounting an electronic device. The region is formed on a first main surface of the resin circuit board 14. Reference numeral 15 is an electronic device such as an IC chip that is mounted on the first main surface of the resin circuit board 14 on face down basis. Reference numeral 16 is a flat-type external connecting terminal that is formed on a second main surface of the resin circuit board 14 through a through-hole 17. Reference numeral 18 is a mold resin layer that seals and coats the device mounting region.

In this construction, a connecting portion 14a formed on the resin circuit board 14 is made of a conductive paste. After a corresponding electrode terminal portion 15a of the IC chip 15 was press-fitted on the connecting portion 14a, the conductive paste forming the connecting portion 14a is hardened.

Next, a fabrication method for fabricating the semiconductor package according to the fifth embodiment will be described.

First, the resin circuit board 14 is prepared. The resin circuit board 14 has a wiring pattern including a connecting portion for mounting a flip chip. The wiring pattern is formed on the first main surface of the resin circuit board 14. The flat-type external connecting terminal 16 provided on the rear surface (second main surface) of the resin circuit board 14 is connected to the wiring pattern through the through-hole 17. The through-hole 17 is formed at an outer peripheral portion of the connecting portion. The resin circuit board 14 mounts the IC chip 15. The length, width, and thickness of the resin circuit board 14 are 20 mm, 10 mm, and 0.2 mm, respectively. The length, width, and thickness of the IC chip 15 are for example 15 mm, 5 mm, and 0.25 mm, respectively.

Thereafter, the resin circuit board 14 is secured on a stage of a screen printer with for example a vacuum sucking mechanism so as to form the connecting portion 14 corresponding to the electrode terminal portion of the IC chip 15. In other words, with a metal mask having an opening portion corresponding to the electrode terminal of the IC chip 15, a silver paste is deposited on the first main surface of the resin circuit board 14 by screen printing method. The electrode terminal has for example a width of 100 μm and a length of 100 μm. The opening portion has for example a width of 150 μm and a length of 150 μm. Thickness of the metal mask is 100 μm. The silver paste has for example a particle diameter of silver of 1 μm and a viscosity of 1000 ps. The connecting portion 14a is formed on the connecting surface. The connecting portion 14a has a diameter of 150 μm and a height of 80 μm. A connecting gold bump is formed on the electrode terminal of the IC chip 15 by electroplating method. The connecting gold bump forms the electrode terminal portion 15a.

The electrode terminal portion 15a is aligned and disposed corresponding to the connecting portion 14a on the first main surface of the resin board 14. Thereafter, the connected portions 14a and 15a are pressured. At least the forward edge portion of the electrode terminal portion 15a is buried into the connecting portion 14a so as to assemble a module. In this fabrication step, the first main surface of the resin substrate 14 and the lower surface of the IC chip 15 except for the connected portions 14a and 15a may be adhered by an insulation adhesive agent, thereby reinforcing the connection of the resin substrate 14 and the IC chip 15.

Figure 13:
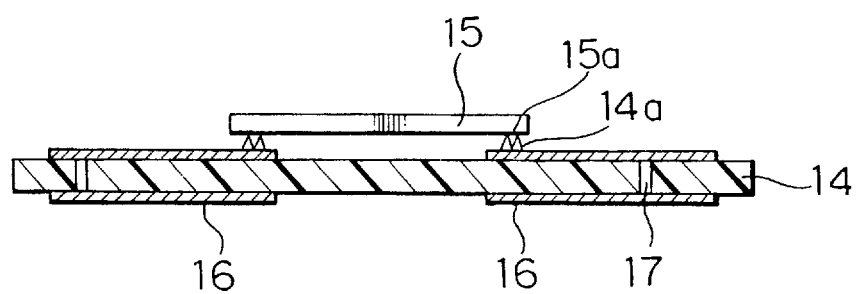
FIG. 13 is a sectional view showing a construction of principal portions of a semiconductor module of the semiconductor package according to the fifth embodiment of the present invention.

In this condition, the silver paste forming the connecting portion 14a is heat-hardened. Thus, so-called flip chip bonding process is completed. In other words, as shown in FIG. 13, a semiconductor module that is secured and held by the resin board 14 and electrically connected therein is assembled.

Figure 14:
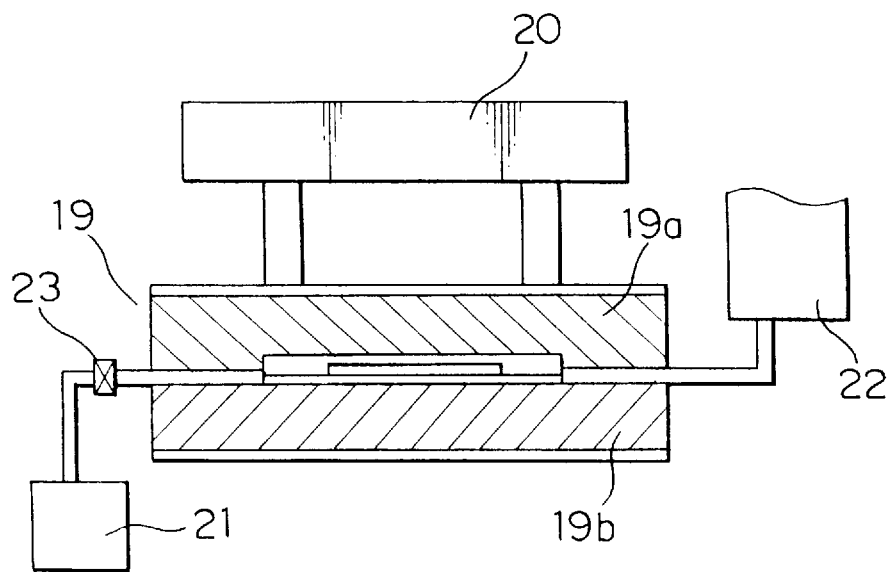
FIG. 14 is a sectional view schematically showing a resin mold in a fabrication step of the semiconductor package according to the fifth embodiment of the present invention.

Thereafter, the assembled module is placed in an injection type a metal mold for injection resin molding that can be deaerated and decompressed. A mold resin is filled in the metal mold with a pressure. Thus, the electronic device mounting surface of the module is molded. FIG. 14 schematically shows such a molding process. In the molding process, an injection type molding unit is provided. The injection type molding unit comprises a metal mold 19, a pressuring mechanism 20, a vacuum pump 21, a resin supply mechanism 22, and a switch valve 23. The metal mold 19 has an upper metal mold 19a and a lower metal mold 19b. The metal molds 19a and 19b each have a heating unit. The vacuum pump 21 deaerates and decompresses the inside of the metal mold 19. The resin supply mechanism 22 supplies a mold resin to the metal mold 19. The switch valve 23 switches among vacuum atmosphere, decompressed atmosphere, and normal atmosphere in the metal mold. The module is placed in the metal molding unit. Thereafter, the vacuum pump 21 is operated so as to deaerate or decompress the inside of the metal molding unit. In this condition, a low viscosity epoxy resin is supplied to the metal molding unit where the module is placed. The epoxy resin is filled in to metal molding unit. Thereafter, the heating units of the upper and lower metal molds 19a and 19b are operated so that the metal mold 19 is heated to the resin hardening temperature. Thus, the mold resin is hardened. With such a sequence of fabrication steps, a semiconductor package shown in FIG. 12 can be provided.

The thickness of the semiconductor package is as thin as 0.53 μm. In this embodiment, in comparison with the semiconductor module fabricated by the COB method, the thickness of the IC chip 15 and the resin circuit board 14 can be increased for the thickness of the bonding wires. In other words, according to this embodiment, the semiconductor package can be more easily fabricated, thereby contributing to improving the yield. In contrast, when the thickness of the IC chip 15 and the resin circuit board 14 is not changed, the thickness of the semiconductor package can be reduced.

In the case of the injection molding process according to this embodiment, the resin used for the molding process is an epoxy resin with a relatively low viscosity or a liquid epoxy resin. In addition, the inside of the metal mold is deaerated or decompressed. Thus, since the fluidity of the mold resin increases, the resin smoothly permeates fine regions of the module. Thus, the resin can be densely filled and molded. Thus, the connecting portion 14a and the electrode terminal portion 15a can be prevented from being separated. In addition, the IC chip 15 can be prevented from being damaged. Thus, problems that tend to take place in the conventional single side mold sealing process can be remarkably solved or reduced. In other words, in the conventional molding means, when a resin is permeated to fine regions of the module, the resin should be injected with a high pressure. Thus, the resin circuit board 14 and the connecting portion 14a tend to be damaged. Consequently, the electrode terminal porion 15a of the IC chip 15 tends to be damaged. Unlike with the conventional molding means, according to the fabrication method of this embodiment, a semiconductor package with a high yield can be provided. Thus, this fabrication method provides many practical advantages.

Figure 1:
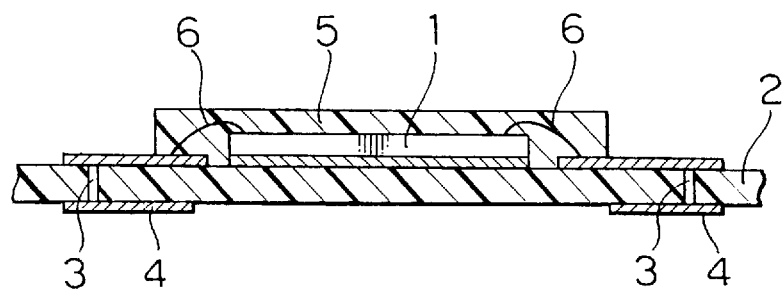
FIG. 1 is a sectional view showing a construction of principal portions of a conventional semiconductor package.

As a comparing example, an IC chip with a thickness of 0.25 mm is disposed on a resin board with a thickness of 0.2 mm by the COB method. The IC chip and the resin board are connected by wire bonding method (the height of the wire bonding portion is 0.15 mm). The resultant module is molded on one surface by the conventional molding means. Thus, a semiconductor package shown in FIG. 1 is provided. The thickness of the thinnest portion of the mold resin layer is 0.05 mm. The total thickness of the semiconductor package is as large as 0.65 mm.

Sixth Embodiment

An IC chip 15 having an electrode terminal portion 15a is prepared. The electrode terminal portion 15a is formed of a pad (with a height of 100 $\mu$m) made of a solder (for example, 63Sn-37Pb) deposited on the electrode terminal portion 15a (with a width of 100 $\mu$m and a length of 100 $\mu$m) by selective plating method or evaporating method (with a solder mask). The IC chip 15 is aligned and temporarily secured on a first main surface of the resin circuit board 14 by a flip hip bonder. The module of the IC chip 15 and the resin circuit board 14 is loaded into a solder reflow furnace. The module is heated at a temperature exceeding the solder melting temperature (183° C.) so as to perform flip chip bonding process. Thus, the semiconductor module has been assembled.

Next, with a molding unit similar to that used in the fifth embodiment, in the similar condition, the resin molding process is performed. Thus, a semiconductor package is provided. As with the fifth embodiment, the semiconductor package according to the sixth embodiment is thin and compact, has high reliability in characteristics, and provides high yield.

Figure 15:
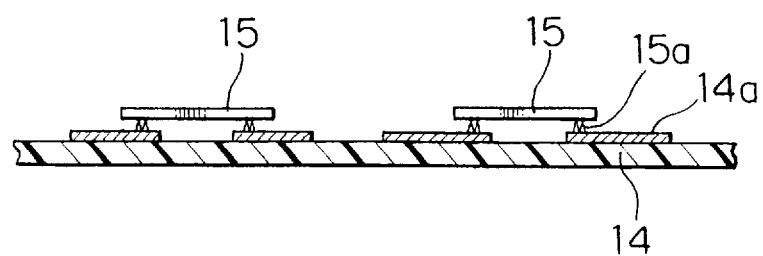
FIG. 15 is a sectional view schematically showing a construction of principal portions of a semiconductor module of a semiconductor package according to a sixth embodiment of the present invention.

As shown in FIG. 15, even if a plurality of IC chips 15 are disposed, the semiconductor package is thin and compact, has high reliability in characteristics, and provides high yield.

Since the semiconductor package according to the first to third embodiments does not have a mold resin layer, it is correspondingly thin and compact and has high reliability in functions. Thus, the semiconductor package is suitable for a functional device for use with a card memory. In particular, since the semiconductor package is thin, the selection range of the thickness of the resin board and IC chip mounted thereon can be widened. Thus, the characteristics and functions corresponding to the applications for use with the semiconductor package can be adjusted. In addition, the scope of the applications of the semiconductor package is widened. In addition, since the semiconductor chip and the circuit board are electrically connected by other than wire bonding method, the mounting efficiency can be improved. Moreover, since the inductance of the circuit can be reduced, the signal speed can be increased.

When the conventional semiconductor chip is connected by wire bonding method, the position of the electrode pad is restricted. However, according to the semiconductor package of the present invention, the position of the electrode pad of the semiconductor chip can be freely selected. Thus, the design concept of the semiconductor chip can be remarkably innovated.

According to the fabrication method of the semiconductor package of the present invention, since the semiconductor package with the above-described excellent functions can be fabricated on quantity basis with high yield, many practical advantages including low cost can be accomplished.

In the COB method, where a plurality of chips are directly mounted on a circuit board, or when a flip chip is mounted, a burn-in process cannot be performed. Thus, the reliability of each chip cannot be assured. In contrast, according to the semiconductor package of the present invention, the resin sealing process can be followed by the burn-in process. Thus, when such chips are mounted on the circuit board, a unit on which a chip is mounted can be accomplished without need to use repair technique for detective parts. In other words, when the semiconductor package according to the present invention is mounted, high reliability can be assured. Consequently, the yield can be increased and the fabrication cost can be decreased.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A thin-type semiconductor package comprising:
    a circuit board having a wiring circuit on a first main surface of the circuit board and a connecting portion on and raised above the wiring circuit, and the connecting portion made of a first metal;
    an electronic device including a semiconductor chip mounted in face-down relation on the first main surface, the chip having an electrode terminal portion on and protruding below a face of the chip, wherein the connecting portion has a raised shape corresponding to the electrode terminal portion so that at least a portion of the electrode terminal portion is buried into the connecting portion, and the electrode terminal portion made of a second metal;
    a flat-type external connecting terminal electrically connected to said electronic device and disposed on and exposed at a second main surface of the circuit board; and
    an insulating resin layer sealing the first main surface of said circuit board including said electronic device, wherein the connecting portion and the electrode terminal portion of the electronic device have a solid-phase diffused zone of the first metal and the second metal.

2. The semiconductor package as set forth in claim 1, wherein the insulating resin layer is formed of an epoxy resin.

3. The semiconductor package as set forth in claim 1, wherein a thickness of the circuit board is in the range from 0.2 to 0.5 mm.

4. The semiconductor package as set forth in claim 1, wherein a thickness of the semiconductor chip is in the range from 0.2 to 0.5 mm.

5. The semiconductor package as set forth in claims 1, 2, 3, or 4, wherein a thickness of the semiconductor package is 1 mm or less.

6. The semiconductor package as set forth in claim 5, wherein the thickness of the semiconductor package is 0.6 mm or less.

7. The semiconductor package as set forth in claim 1, wherein the insulating resin layer is formed by a liquid transfer molding method.

8. A thin-type semiconductor package as set forth in claim 10, wherein the circuit board has a supporting cured resin layer so that the wiring circuit and the connecting portion are exposed.

* * * * *